(12) United States Patent
Zanderigo et al.

(10) Patent No.: US 9,224,738 B1
(45) Date of Patent: Dec. 29, 2015

(54) METHODS OF FORMING AN ARRAY OF GATED DEVICES

(71) Applicant: Micron Technology, Inc., Boise, ID (US)

(72) Inventors: Federica Zanderigo, Milan (IT); Marcello Mariani, Milan (IT); Alessandro Grossi, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/461,730

(22) Filed: Aug. 18, 2014

(51) Int. Cl.
*H01L 21/8242* (2006.01)
*H01L 27/105* (2006.01)
*H01L 21/8234* (2006.01)
*H01L 21/768* (2006.01)
*H01L 27/102* (2006.01)
*H01L 21/8222* (2006.01)
*H01L 21/311* (2006.01)
*H01L 21/3213* (2006.01)
(Continued)

(52) U.S. Cl.
CPC ........ *H01L 27/105* (2013.01); *H01L 21/31111* (2013.01); *H01L 21/32134* (2013.01); *H01L 21/32139* (2013.01); *H01L 21/768* (2013.01); *H01L 21/76224* (2013.01); *H01L 21/8222* (2013.01); *H01L 21/823412* (2013.01); *H01L 21/823437* (2013.01); *H01L 21/823475* (2013.01); *H01L 21/823487* (2013.01); *H01L 27/1022* (2013.01); *H01L 27/1027* (2013.01); *H01L 29/4236* (2013.01); *H01L 29/42364* (2013.01)

(58) Field of Classification Search
None
See application file for complete search history.

(56) References Cited

U.S. PATENT DOCUMENTS

| 3,988,771 A | 10/1976 | Krishna |
| 5,412,598 A | 5/1995 | Shulman |
| 5,465,249 A | 11/1995 | Cooper, Jr. et al. |

(Continued)

FOREIGN PATENT DOCUMENTS

| JP | 2003-030980 | 1/2003 |
| KR | 10-2010-0070835 | 6/2010 |

(Continued)

OTHER PUBLICATIONS

U.S. Appl. No. 14/265,168, filed Apr. 29, 2014, Righetti et al.
(Continued)

*Primary Examiner* — Angel Roman
(74) *Attorney, Agent, or Firm* — Wells St. John, P.S.

(57) ABSTRACT

A method of forming an array of gated devices includes forming trenches between walls that longitudinally extend in rows and project elevationally from a substrate. The walls comprise semiconductor material. Gate dielectric is formed within the trenches laterally over side surfaces of the walls and conductive gate material is formed within the trenches laterally over side surfaces of the gate dielectric. Side surfaces of an elevationally inner portion of the gate material within the trenches are laterally covered with masking material and side surfaces of an elevationally inner portion of the gate material within the trenches are laterally uncovered by the masking material. The elevationally outer portion of the gate material that is laterally uncovered by the masking material is removed while the side surfaces of the elevationally inner portion of the gate material are laterally covered by the masking material to form gate lines within the trenches laterally over elevationally inner portions of the walls.

24 Claims, 10 Drawing Sheets

(51) Int. Cl.
*H01L 29/423* (2006.01)
*H01L 21/762* (2006.01)

(56) References Cited

U.S. PATENT DOCUMENTS

| | | | |
|---|---|---|---|
| 5,510,630 | A | 4/1996 | Agarwal et al. |
| 5,874,760 | A | 2/1999 | Burns, Jr. et al. |
| 5,930,640 | A | 7/1999 | Kenney |
| 6,017,778 | A | 1/2000 | Pezzani |
| 6,576,944 | B2 | 6/2003 | Weis |
| 6,627,924 | B2 | 9/2003 | Hsu et al. |
| 6,653,174 | B1 | 11/2003 | Cho et al. |
| 6,690,039 | B1 | 2/2004 | Nemati et al. |
| 6,713,791 | B2 | 3/2004 | Hsu et al. |
| 6,870,202 | B2 | 3/2005 | Oka |
| 6,891,205 | B1 | 5/2005 | Cho et al. |
| 6,914,286 | B2 | 7/2005 | Park |
| 6,934,209 | B2 | 8/2005 | Marr |
| 6,958,513 | B2 | 10/2005 | Wang |
| 6,965,129 | B1 | 11/2005 | Horch et al. |
| 7,015,092 | B2 | 3/2006 | Jaiprakash et al. |
| 7,029,956 | B2 | 4/2006 | Hsu et al. |
| 7,081,663 | B2 | 7/2006 | Bulucea |
| 7,151,024 | B1 | 12/2006 | Forbes |
| 7,195,959 | B1 | 3/2007 | Plummer et al. |
| 7,304,327 | B1 | 12/2007 | Nemati et al. |
| 7,326,969 | B1 | 2/2008 | Horch |
| 7,362,609 | B2 | 4/2008 | Harrison et al. |
| 7,378,325 | B2 | 5/2008 | Kaneko et al. |
| 7,440,310 | B2 | 10/2008 | Bhattacharyya |
| 7,456,439 | B1 | 11/2008 | Horch |
| 7,488,627 | B1 | 2/2009 | Nemati et al. |
| 7,786,505 | B1 | 8/2010 | Yang et al. |
| 7,816,728 | B2 | 10/2010 | Ho et al. |
| 7,897,440 | B1 | 3/2011 | Horch |
| 8,102,025 | B2 | 1/2012 | Ozecki et al. |
| 8,288,795 | B2 | 10/2012 | Tang et al. |
| 8,435,859 | B2 | 5/2013 | Housley |
| 8,501,559 | B2 * | 8/2013 | Tang et al. ............ 438/238 |
| 8,518,812 | B2 | 8/2013 | Mariani et al. |
| 8,519,431 | B2 | 8/2013 | Nemati et al. |
| 8,564,034 | B2 * | 10/2013 | Masuoka et al. ............ 257/291 |
| 8,598,621 | B2 | 12/2013 | Tang |
| 2002/0094619 | A1 | 7/2002 | Mandelman et al. |
| 2002/0158254 | A1 | 10/2002 | Hsu et al. |
| 2004/0159853 | A1 | 8/2004 | Nemati et al. |
| 2008/0003774 | A1 | 1/2008 | Baek |
| 2008/0124867 | A1 * | 5/2008 | Brown ............ 438/268 |
| 2009/0140290 | A1 | 6/2009 | Schulze et al. |
| 2009/0189228 | A1 | 7/2009 | Zhang et al. |
| 2010/0197141 | A1 | 8/2010 | Tu et al. |
| 2011/0024791 | A1 | 2/2011 | Schulze et al. |
| 2011/0223731 | A1 | 9/2011 | Chung et al. |
| 2012/0205736 | A1 | 8/2012 | Housley et al. |
| 2012/0223369 | A1 | 9/2012 | Gupta et al. |
| 2012/0228629 | A1 | 9/2012 | Nemati et al. |
| 2014/0106554 | A1 | 4/2014 | Pozzi et al. |

FOREIGN PATENT DOCUMENTS

| | | |
|---|---|---|
| WO | PCT/US2012/021438 | 8/2012 |
| WO | PCT/US2012/025109 | 9/2012 |
| WO | PCT/US2012/021438 | 8/2013 |
| WO | PCT/US2012/025109 | 9/2013 |

OTHER PUBLICATIONS

U.S. Appl. No. 14/461,751, filed Aug. 18, 2014, Mariani et al.
U.S. Appl. No. 14/461,689, filed Aug. 8, 2014, Zanderigo et al.
Burke et al., "Silicon Carbide Thyristors for Power Applications", Pulsed Power Conference 1995, Digest of Technical Papers, 10th IEEE International vol. 1, United States, pp. 327-335.
Cheong et al., "Investigation of Ultralow Leakage in MOS Capacitors on 4H SiC", IEEE Transactions on Electron Devices, vol. 51(9), Sep. 2004, pp. 1361-1365.
Cho et al., A Novel Capacitor-Less DRAM Cell Using Thin Capacitively-Coupled Thyristor (TCCT), IEEE, 2005, 4 pages.
Dimitraiadis et al., "New a-SiC, Optically Controlled, Thyristor-Like Switch", Electronics Letters, vol. 28)17), Aug. 13, 1992, pp. 1622-1624
Jen et al., "Electrical and Luminescent Characteristics of a-SiC:H P-I-: Thin-Film LED's with Graded-Gap Junctions", IEEE Transactions on Electron Devices, vol. 44(4), Apr. 1997, pp. 565-571.
Nemati et al., A Novel High Density, Low Voltage SRAM Cell with a Vertical NDR Device, IEEE, 1998, 2 pages.
Powell et al., "SiC Materials-Progress, Status, and Potential Roadblocks", Proceedings of the IEEE, vol. 90(6), Jun. 2002, pp. 942-955.
Sasago et al., "Cross-point phase change memory with 4F2 cell size driven by low-contact-resistivity poly-Si diode", Symposium on VLSI Technology Digest of Technical Papers, 2009, pp. 24-25.
Sugizaki et al., "35-nm Gate-Length and Ultra Low-voltage (0.45 V) Operation Bulk Thyristor-SRAM/DRAM (BT-RAM) Cell with Triple Selective Epitaxy Layers (TELs)", Symposium on VLSI Technology Digest of Technical Papers, 2008.
Suliman et al., Gate-Oxide Grown on the Sidewalls and Base of a U-Shaped Si Trench: Effects of the Oxide and Oxide/Si Interface Condition on the Properties of Vertical MOS Devices, Microelectronic Engineering, vol. 72, pp. 247-252; 2004.
Tzeng et al., "Dry Etching of Silicon Materials in SF6 Based Plasmas", J. Electrochem. Soc., 1987 vol. 134, issue 9, pp. 2304-2309.
Xie et al., "A Veritically Integrated Bipolar Storage Cell in 6H Silicon Carbide for Nonvolatile Memory Applications", IEEE Electron Device Letters, vol. 15(6), Jun. 1994, pp. 212-214.
Yang et al., High Performance CMOS Fabricated on Hybrid Substrate with Different Crystal Orientations, IEEE, 2003, 4 pages.
Yu et al., Low-Temperature Titanium-Based Wafer Bonding, Journal of the Electrocheical Society, vol. 154, No. 1, 2007, pp. H20-H25.

* cited by examiner

ND OF AN ARRAY OF
GATED DEVICES

TECHNICAL FIELD

Embodiments disclosed herein pertain to methods of forming arrays of gated devices.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The data/sense lines may conductively interconnect memory cells along columns of the array, and the access lines may conductively interconnect memory cells along rows of the array. Each memory cell may be uniquely addressed through the combination of a data/sense line and an access line.

Memory cells may be volatile, semi-volatile, or non-volatile. Non-volatile memory cells can store data for extended periods of time in the absence of power. Nonvolatile memory is conventionally specified to be memory having a retention time of at least about 10 years. Volatile memory dissipates and therefore requires being refreshed/rewritten to maintain data storage. Volatile memory may have a retention time of milliseconds, or less. The memory cells are configured to retain or store memory in at least two different selectable states. In a binary system, the states are considered as either a "0" or a "1". In other systems, at least some individual memory cells may be configured to store more than two levels or states of information.

Gated devices may be used in memory and other integrated circuitry. Example gated devices are field effect transistors (FETs), gated bipolar junction transistors (BJTs), and thyristors. The processing used in fabricating gated devices can be complex. Such complexities can be problematic in semiconductor fabrication processes in that they may increase costs, reduce throughput, and create risks of misalignment or other errors. Accordingly, it is desired to develop new methods of fabricating gated devices.

DETAILED DESCRIPTION OF EXAMPLE EMBODIMENTS

Embodiments of the invention encompass methods of forming an array of gated devices. Two example gated devices are shown in FIGS. 1 and 2, with FIG. 1 showing a gated transistor 10 and FIG. 2 showing a thyristor 20.

Figure 1:
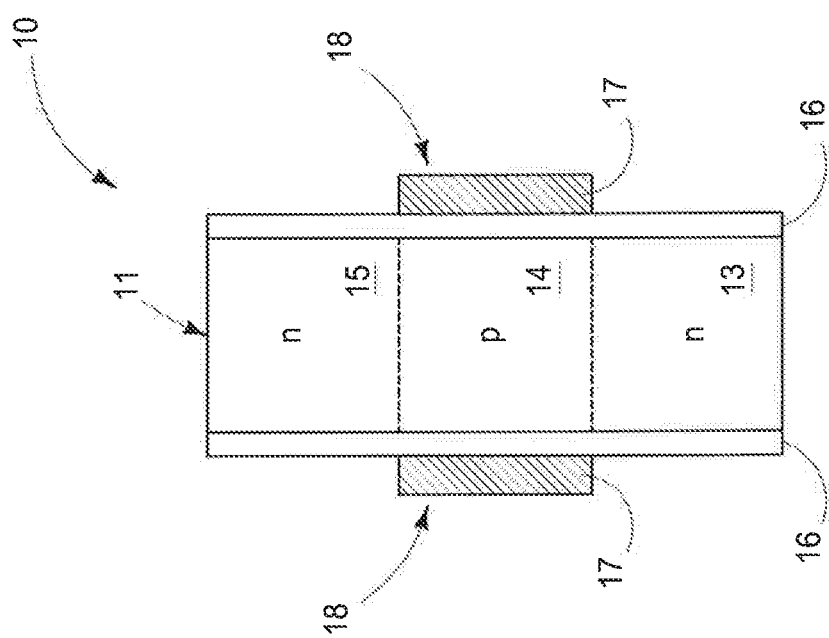
FIG. 1 is a diagrammatic vertical section view of a gated device that may be encompassed in embodiments of the invention.

Transistor 10 of FIG. 1 comprises semiconductor material 11 having three doped regions 13, 14, and 15 therein (dashed lines being used to show approximate interfaces of such regions). Any suitable semiconductive material may be used, with monocrystalline and/or polycrystalline silicon being examples. Any of the materials and/or structures described herein may be homogenous or non-homogenous, and regardless may be continuous or discontinuous over any material that such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

Region 13 comprises an elevationally inner region. Region 14 comprises a mid region elevationally outward of inner region 13. Region 15 comprises an elevationally outer region elevationally outward of mid region 14. In this document, "upper", "lower", "elevational", "top", and "bottom" are with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space. Regions 13, 14, and 15 are shown as being n-type, p-type and n-type, respectively, such that device 10 is an NPN device. As an alternate example, the conductivity types of regions 13, 14, and 15 may be reversed such that the device is a PNP device. A gate dielectric 16 is along sidewalls of semiconductor material 11, and conductive (i.e., electrically) gate material 17 is over gate dielectric 16 operatively laterally proximate mid region 14. Gate material 17 forms or comprises part of access lines 18 that may extend into and out of the page relative to the cross-section of FIG. 1. Although there appears to be two separate access lines 18 on opposing sides of semiconductor material 11, in practice such access lines may be electrically coupled to one another in a location outside of the page so that they are part of a single continuous gate line. In the context of this document, devices or components are electrically coupled relative one another if in normal operation electric current is capable of continuously flowing from one to the other, and does so predominately by movement of subatomic positive and/or negative charges when such are sufficiently generated as opposed to predominately by movement of ions. Access lines 18 may extend only along two opposing sides of semiconductor material 11, or may wrap entirely around semiconductor material 11 for example where material 11 is in the shape of a pillar. As an alternate example, an access line 18 may be on only one side (not shown) of semiconductor material 11. Further, gate dielectric 16 is shown as extending elevationally outward and elevationally inward of access lines 18, although such is not required. As examples, transistor 10 may be a FET or a BJT.

Figure 2:
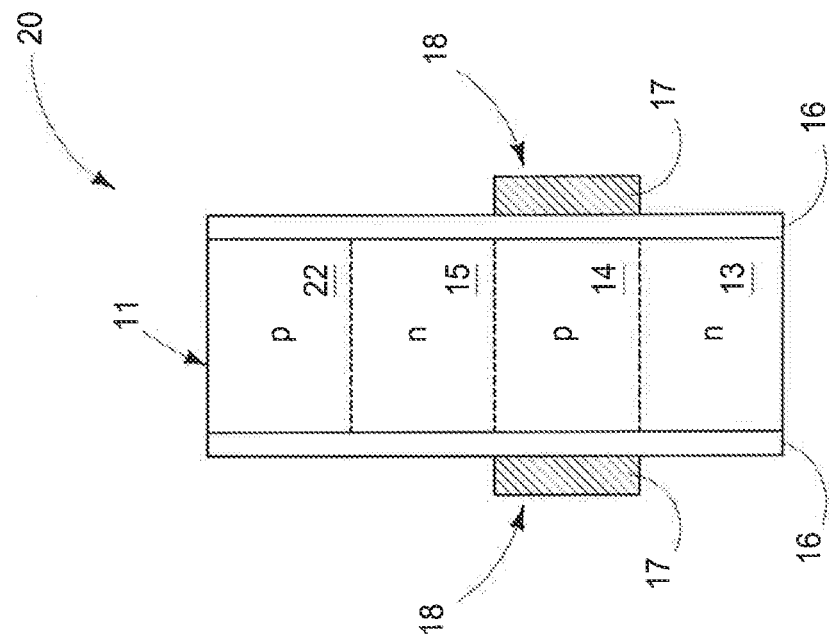
FIG. 2 is a diagrammatic vertical section view of a gated device that may be encompassed in embodiments of the invention.

In FIG. 2 with respect to thyristor 20, like numerals from FIG. 1 have been used where appropriate, with a construction difference being indicated with a different numeral. Thyristor 20 comprises semiconductor material 11 having four doped regions 13, 14, 15, and 22, with region 22 being elevationally outward of outer region 15. In the depicted embodiment, regions 13, 14, 15, and 22 are n-type, p-type, n-type, and p-type, respectively, such that device 20 is an NPNP device. As another example, such conductivity types may be reversed whereby the device is a PNPN device.

FIGS. 1 and 2 show but two example gated devices 10 and 20 that may be encompassed in embodiments of the invention. However, other gated devices, whether existing or yet-to-be-developed, may be used.

Figure 3:
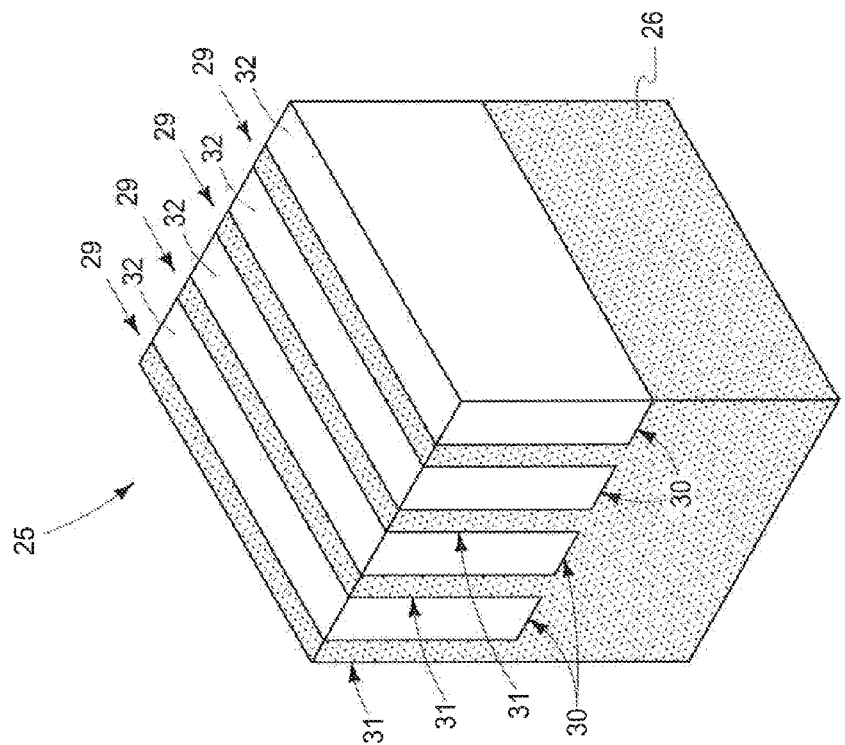

Example methods of forming an array of gated devices in accordance with embodiments of the invention are shown and described with reference to FIGS. 3-20. Like numerals from the above-described embodiments have been used where appropriate, with some construction differences being shown with letter suffixes or different numerals. FIG. 3 shows a fragment of a semiconductor substrate 25 comprising semiconductor material 26. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Example semiconductor material 26 is doped or undoped monocrystalline and/or polycrystalline silicon.

Semiconductor material 26 has been removed elevationally inward (e.g., by anisotropic etching), thereby forming trenches 30 and walls 31. The array of gated devices being formed will be arranged in rows and columns, with walls 31 in the FIG. 3 example extending along columns 29. Use of "row" and "column" in this document is for convenience in distinguishing one series or orientation of lines from another series or orientation of lines and along which devices have been or will be formed. "Row" and "column" are used synonymously with respect to any series of devices, components, and/or features independent of function. Regardless, the rows may be straight and/or curved and/or parallel and/or not parallel relative one another, as may be the columns. Further, the rows and columns may intersect relative one another at 90° or at one or more other angles. Trenches 30 have been filled with dielectric material 32 (e.g., silicon dioxide and/or silicon nitride), followed by planarization back to expose semiconductor material 26. Such may be conducted, by way of example, by one or both of chemical mechanical polishing and etching. Masking material 34 (e.g., silicon dioxide and/or silicon nitride) has been formed elevationally over materials 26 and 32.

Figure 4:
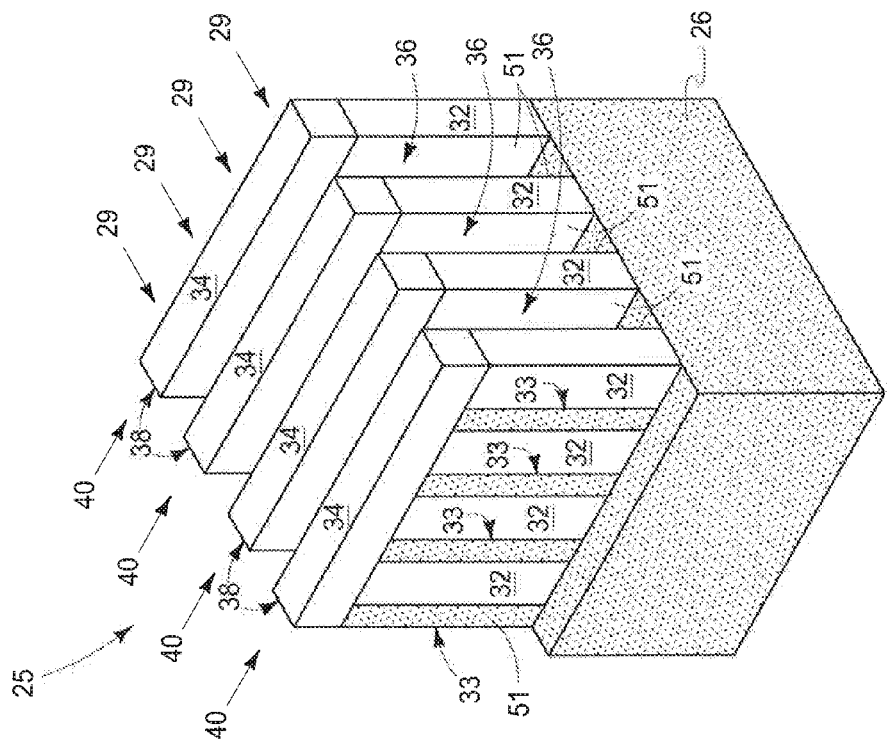
FIGS. 3-12 and 15-17 are diagrammatic sequential isometric views of a substrate in process in accordance with some embodiments of the invention.

Referring to FIG. 4, masking material 34 has been patterned along rows 40 and used as a mask in anisotropically etching materials 26 and 32. Trenches 36 have thereby been formed between walls 38 that longitudinally extend along rows 40. Walls 38 may be considered individually as having two opposing side surfaces 51. In one embodiment and as shown, walls 38 comprise pillars 33 of semiconductor material 26 spaced longitudinally within walls 38 by dielectric material 32.

Figure 5:
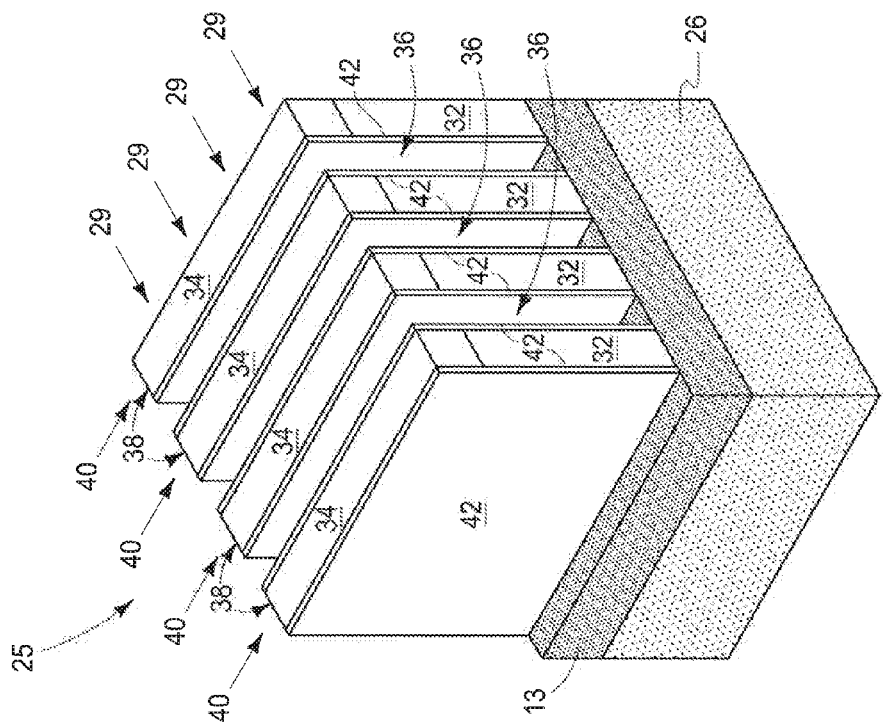

Referring to FIG. 5, a thin dielectric material 42 (e.g., silicon dioxide and/or silicon nitride) has been deposited and anisotropically etched back to substantially remove such from being over horizontal surfaces. In one embodiment, materials 42 and 34 are of the same composition and material 32 is of different composition from that of materials 42 and 34. Material 42 may be provided, for example, to prevent subsequent spurious pillar implantation. After forming material 42, ion implantation and diffusion have been conducted into and through the bottoms of trenches 36 thereby at least partially forming inner regions (e.g., 13) of different gated devices. Pillars 33 (not viewable in FIG. 7) are ultimately formed to individually comprise an elevational mid region (e.g., 14) and an elevationally outer region (e.g., 15 or 22) of individual gated devices, such as devices 10 or 20 as shown in FIGS. 1 and 2. Desired dopant type(s) and concentration(s) for the mid regions and the outer regions may be formed at any suitable time and in any order, ideally some time after formation of pillars 33, and are not specifically shown in the figures.

Figure 6:
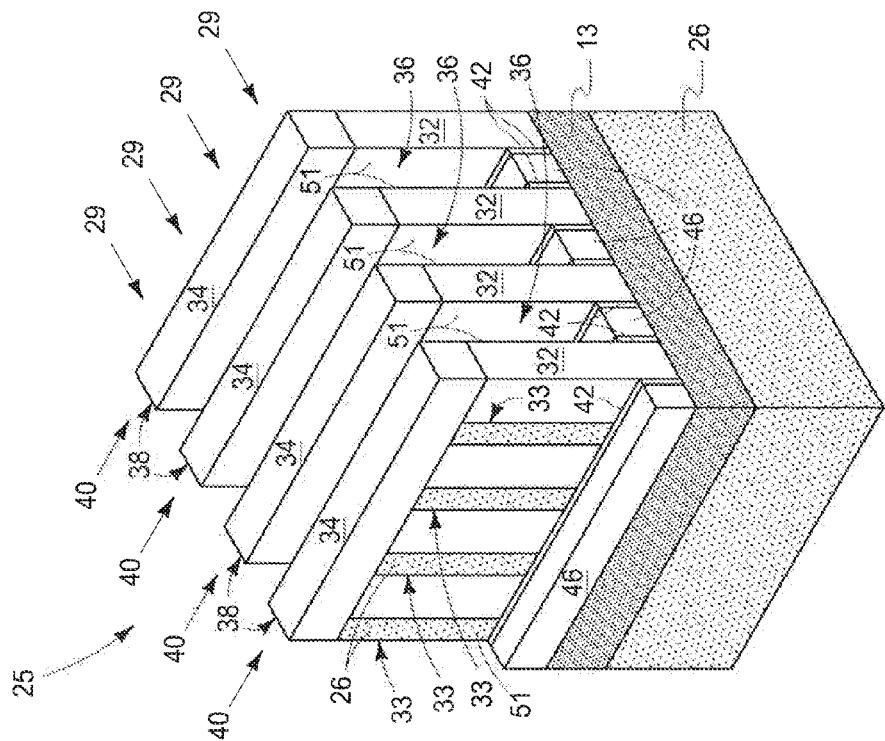

Referring to FIG. 6, remaining volume of trenches 36 has been filled (not shown) with dielectric material 46 (e.g., silicon dioxide and/or silicon nitride). Materials 46 and 42 have then been removed back (e.g., by wet and/or dry etching) to expose sidewalls of pillars 33. In one embodiment, materials 32 and 46 are of the same composition relative one another.

Figure 7:
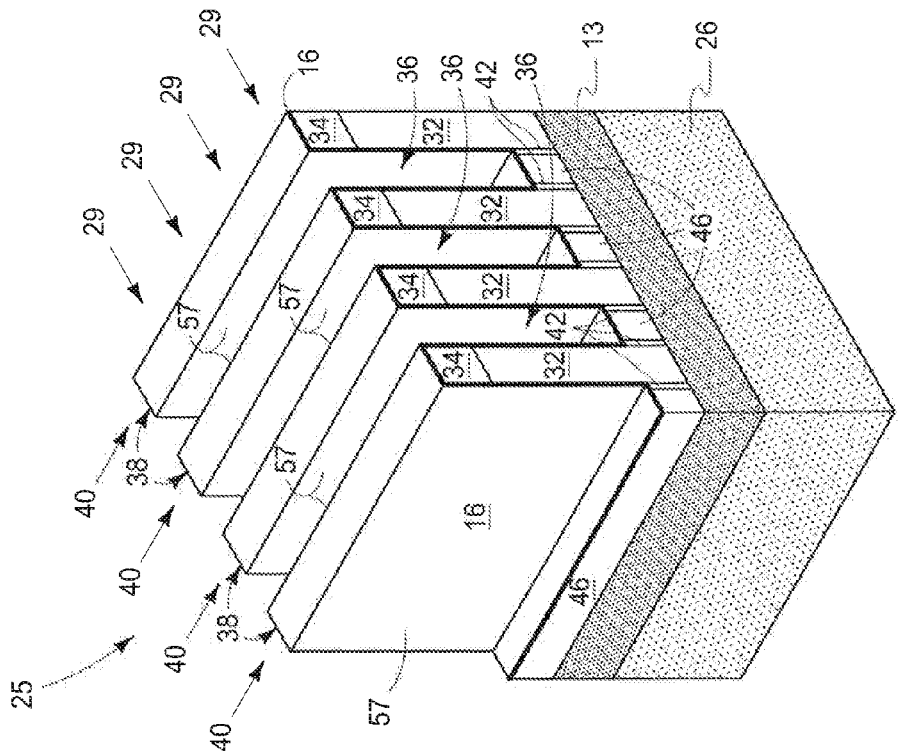

Referring to FIG. 7, gate dielectric 16 has been formed within trenches 36 laterally over side surfaces 51 (not shown) of walls 38, thereby forming side surfaces 57 of gate dielectric 16.

Figure 8:
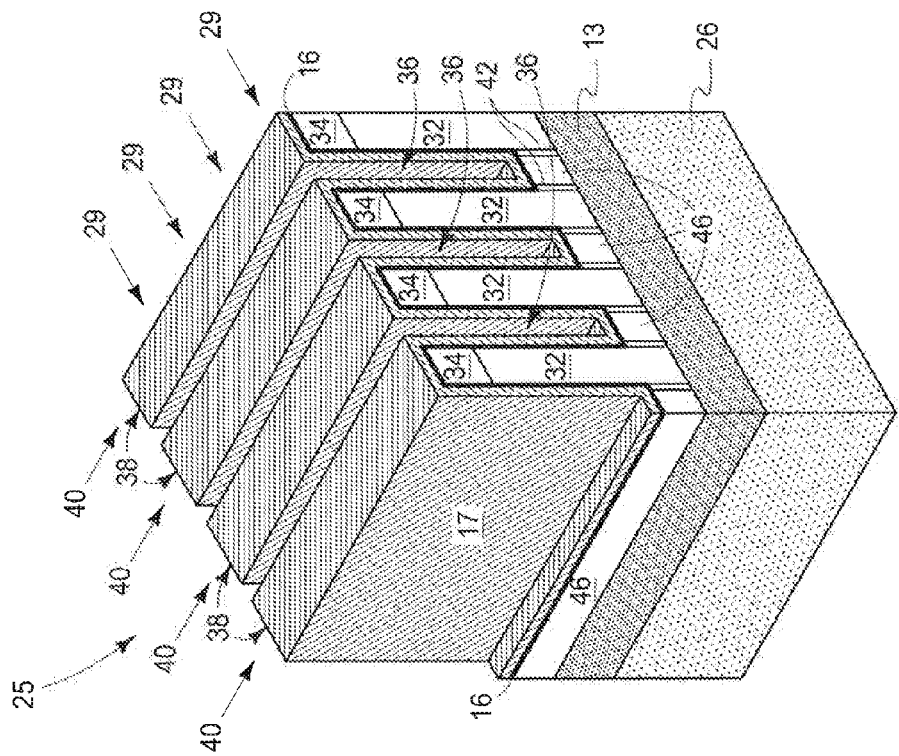

Referring to FIG. 8, conductive gate material 17 has been formed within trenches 36 laterally over side surfaces 57 of gate dielectric 16. In some embodiments and as shown, gate dielectric 16 and gate material 17 have been formed within trenches 36 by depositing gate dielectric 16 and gate material 17 elevationally over the tops of walls 38, laterally over side surfaces of walls 38, and elevationally over the bases of trenches 36.

Figure 9:
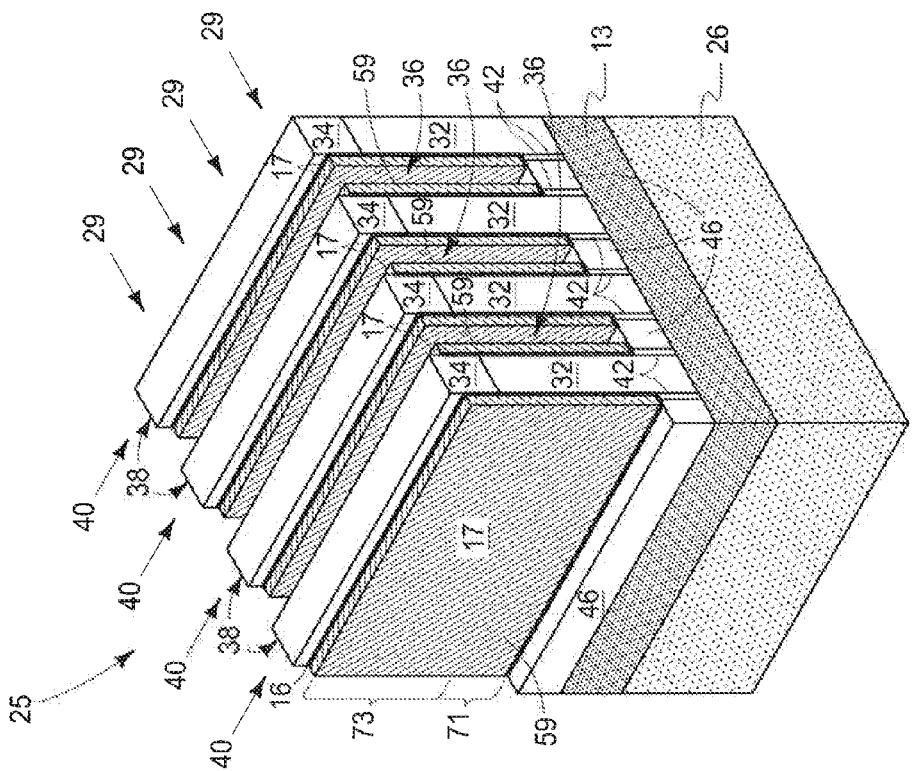

Referring to FIG. 9, gate dielectric 16 and gate material 17 have been removed (e.g., by wet and/or dry isotropic and/or anisotropic etching) from being over the tops of walls 38 and from being over a majority of the trench bases. In one embodiment and as shown, the removing of gate dielectric 16 and gate material 17 may comprise elevationally recessing one or both of such materials within trenches 36. Accordingly, one of both of materials 16 and 17 may have respective elevationally outermost surfaces that are elevationally inward of that of material 34. Gate material 17 within trenches 36 may be considered as comprising side surfaces 59 and an elevationally inner portion 71 and an elevationally outer portion 73.

Figure 10:
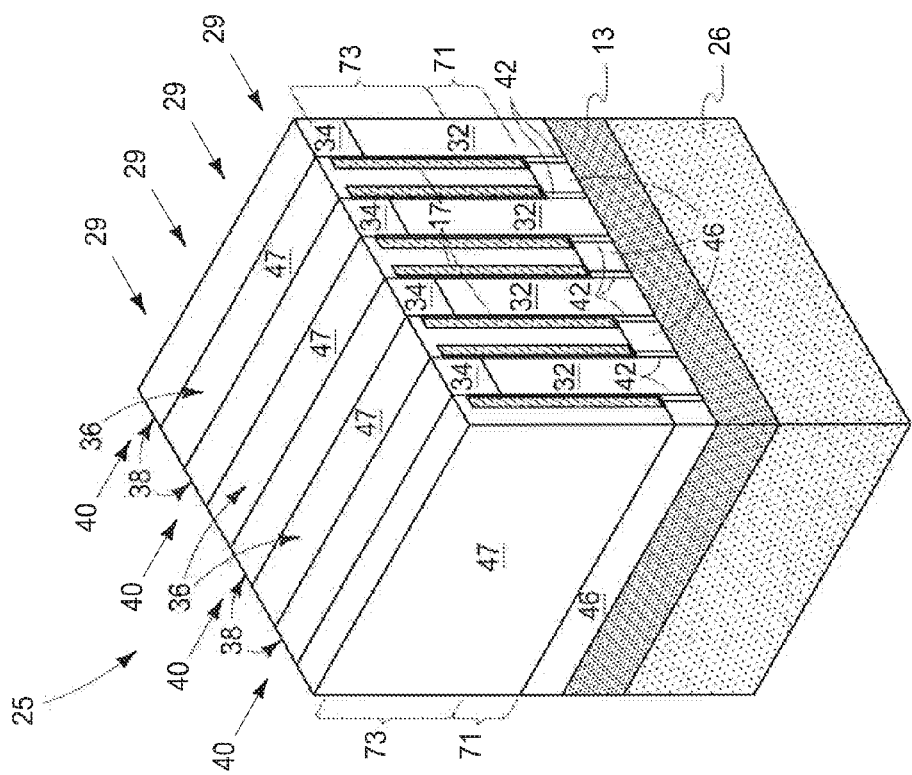

Referring to FIG. 10, masking material 47 has been deposited to overfill trenches 36, and has been planarized back. Thereby, side surfaces 59 (not viewable in FIG. 10) of elevationally outer and inner portions 73 and 71, respectively, of gate material 17 within trenches 36 have been laterally covered with masking material 47. In one embodiment, masking material 47 is dielectric (e.g., silicon dioxide and/or silicon nitride), and in one embodiment remains as part of a finished circuitry construction of the array.

Figure 11:
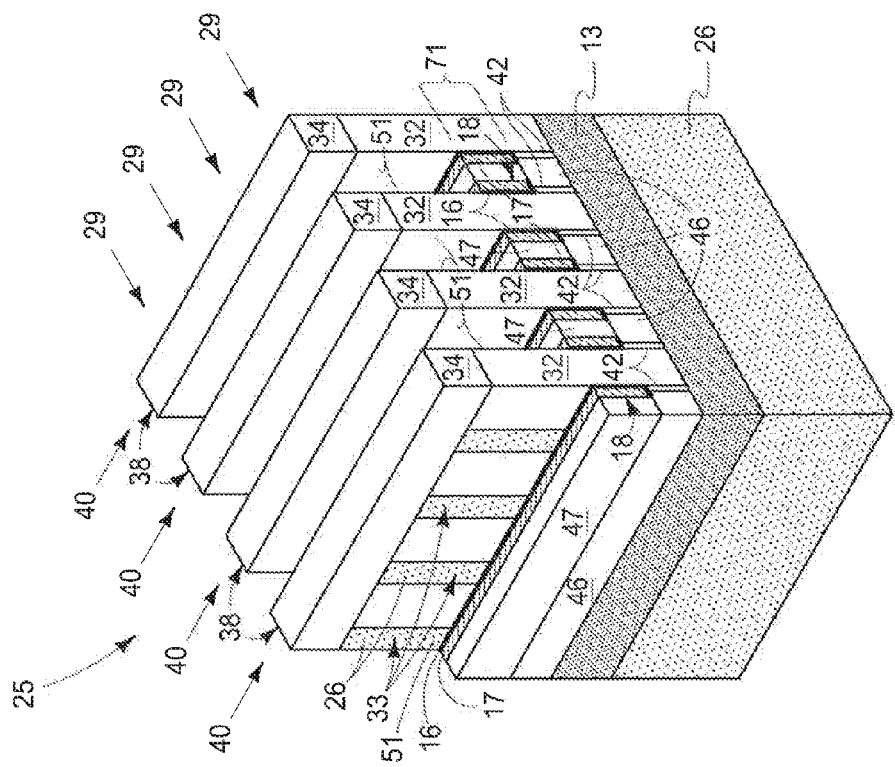

Referring to FIG. 11, masking material 47 has been removed from laterally covering side surfaces 59 of elevationally outer portion 73 of gate material 17 within trenches 36. By way of examples, the removing may occur by wet and/or dry etching of masking material 47 selectively relative to materials 34, 16, and 17. In this document, a selective etch or removal is an etch or removal where one material is removed relative to another stated material at a rate of at least 1.5:1.

The above processing described with reference to FIGS. 10 and 11 is but one example of laterally covering side surfaces 59 of an elevationally inner portion 71 of gate material 17 within trenches 36 with masking material 47 and leaving side surfaces 59 of an elevationally outer portion 73 of gate material 17 within trenches 36 laterally uncovered by masking material 47. Any other existing or yet-to-be-developed processing may be used.

Figure 12:
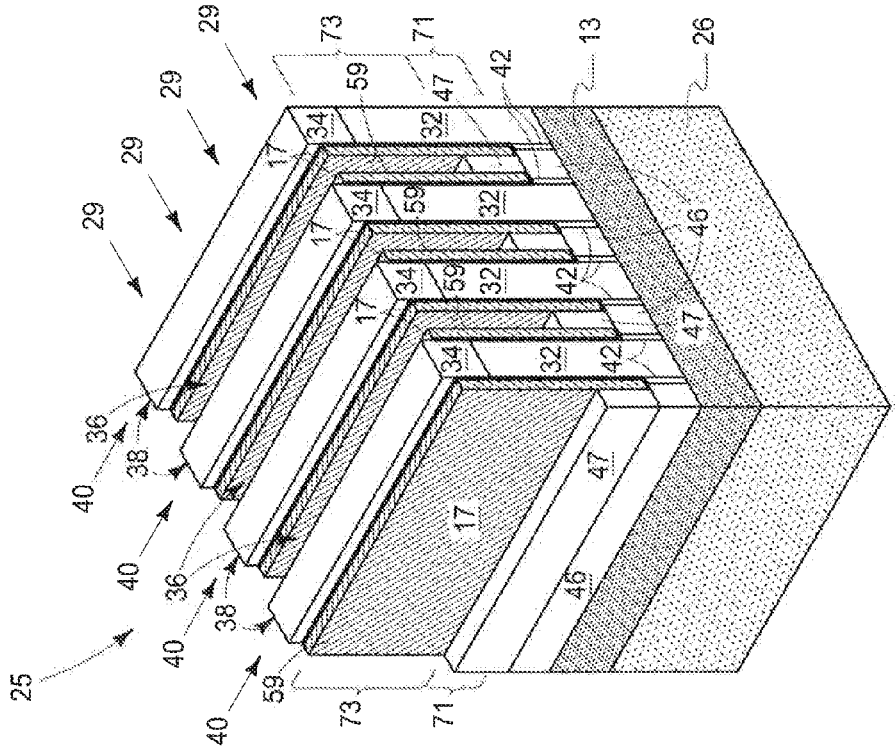
Figure 13:
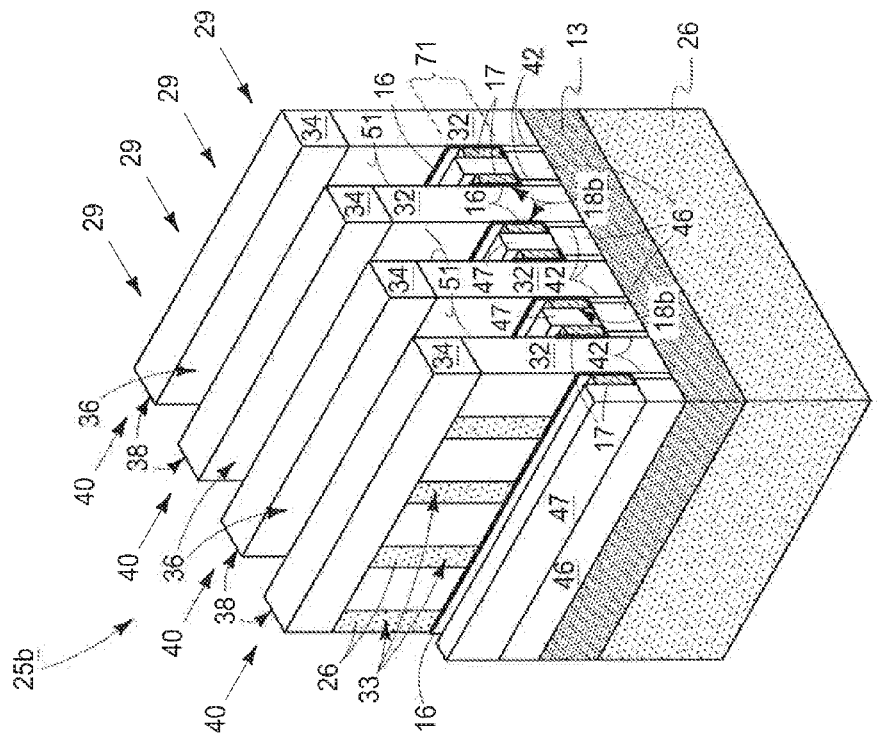
FIG. 13 is a diagrammatic isometric view of a substrate processed alternately or prior to that shown by FIG. 12.

Referring to FIG. 12, elevationally outer portion 73 (not shown) of gate material 17 that is laterally uncovered by masking material 47 has been removed (e.g., by dry and/or wet isotropic and/or anisotropic etching) while side surfaces 59 of elevationally inner portion 71 of gate material 17 are laterally covered by masking material 47. Thereby, gate lines 18 within trenches 36 are formed laterally over elevationally inner portions of walls 38. The removing of elevationally outer portion 73 of gate material 17 that is laterally uncovered by masking material 47 may be conducted selectively relative to gate dielectric 16 to leave gate dielectric 16 laterally covering side surfaces 51 of elevationally outer portions of walls 38. Alternately, such removing may be conducted non-selectively. FIG. 13 shows example processing different from or prior to that shown in FIG. 12. In FIG. 13, removal of outer portion 73 (not shown) of gate material 17 that is laterally uncovered by masking material 47 has been conducted selectively relative to gate dielectric 16a with respect to a substrate fragment 25a. Like numerals from the above-described embodiments have been used where appropriate, with some construction differences being indicated with the suffix "a".

In one embodiment and as shown in FIGS. 12 and 13, masking material 47 at conclusion of the removing of gate material 17 has an elevational thickness the same as that of gate lines 18. In this document, "thickness" by itself (no preceding directional adjective) is the mean straight-line distance through a given material or region perpendicularly from a closest surface of an immediately adjacent material of different composition or of an immediately adjacent region. Additionally, the various materials described herein may be of substantially constant thickness or of variable thicknesses. If of variable thickness, thickness refers to average thickness.

FIG. 12 depicts an example embodiment which includes the removing (e.g., by dry and/or wet isotropic and/or anisotropic etching) of an elevationally outer portion (not shown) of gate dielectric 16 that is laterally uncovered by masking material 47 while side surfaces 57 (not viewable in FIG. 12) of an elevationally inner portion of gate dielectric 16 are laterally covered by masking material 47 to form gate dielectric 16 that is elevationally coextensive to tops of individual gate lines 18. Such removal of a portion of gate dielectric 16 may be conducted while removing gate material 17, or subsequently. Regardless, FIG. 12 depicts an example embodiment wherein the removing of elevationally outer portion 73 (not shown) of gate material 17 does not remove any of elevationally inner portion 71 of gate material 17 that is laterally covered by masking material 47.

Figure 14:
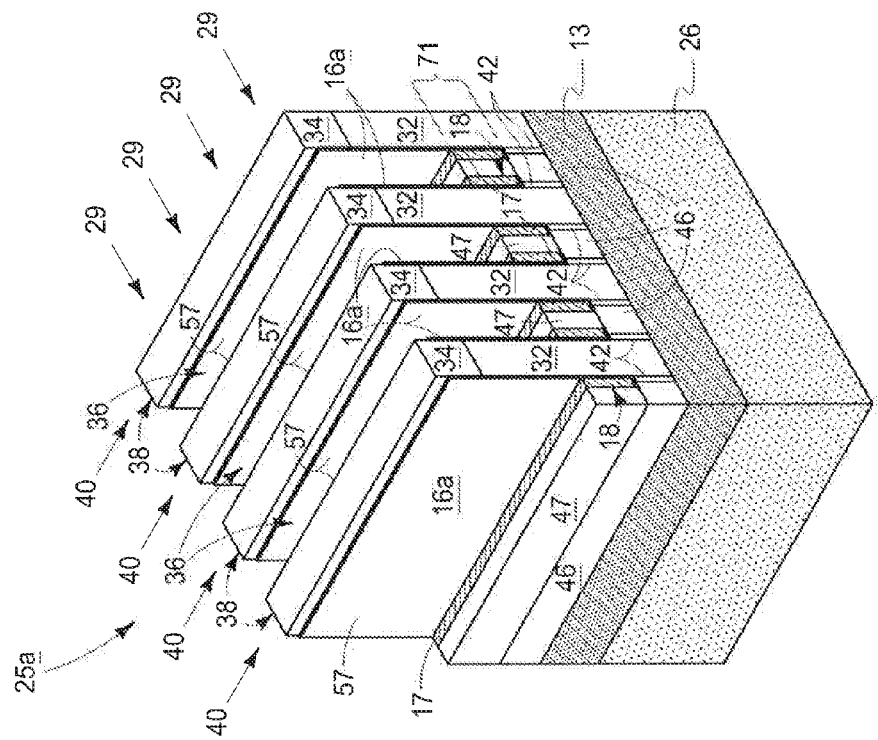
FIG. 14 is a diagrammatic isometric view of a substrate processed alternately to that shown by FIG. 12.

FIG. 14 shows alternate example processing to that of FIG. 12 with respect to a substrate fragment 25b. Like numerals from the above-described embodiments have been used where appropriate, with some construction differences being indicated with the suffix "b". In FIG. 14, the removing of elevationally outer portion 73 (not shown) of gate material 17 has also removed some of elevationally inner portion 71 of gate material 17 that is laterally covered by masking material 47, thereby forming gate lines 18b. Some of gate dielectric 16 may alternately or additionally be removed (not shown) or may not be so removed (as shown). Accordingly, and if the tops are planar, gate material 17 and gate dielectric 16 may or may not have elevationally coincident tops, and regardless either or both of which may or may not be elevationally coincident with tops of masking material 47.

Figure 15:
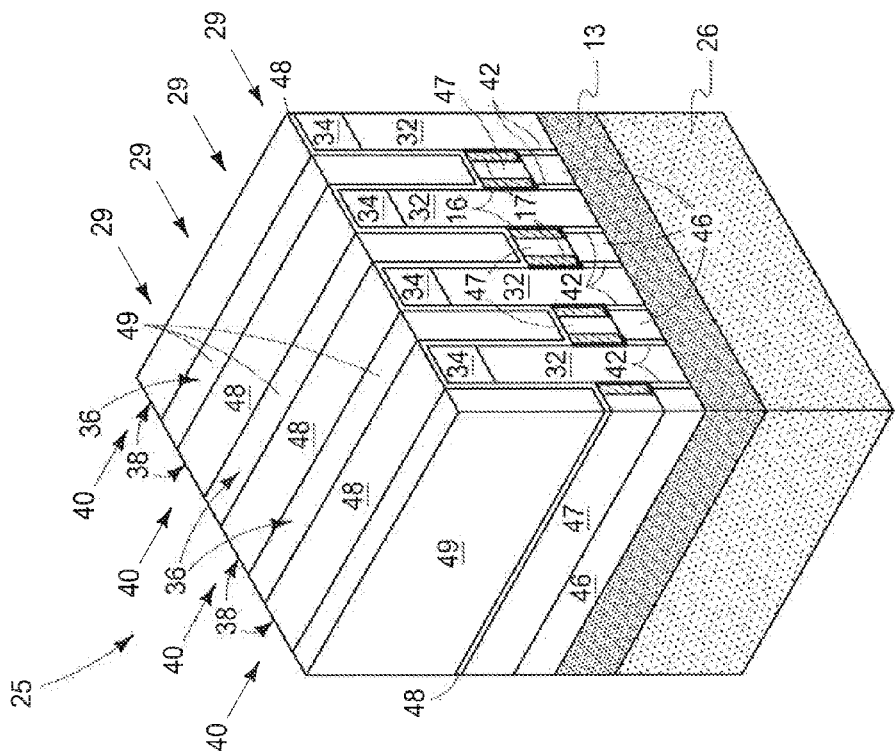

Referring to FIG. 15, remaining volume of trenches 36 has been filled with dielectric material. In one embodiment, such comprises depositing a first composition dielectric material 48 (e.g., silicon nitride) to line and less-than-fill the remaining volume of trenches 36. This has been followed by deposition of a second composition dielectric material 49 (e.g., silicon dioxide) within trenches 36 over dielectric material 48, with the first and second compositions being different relative one another. In one embodiment and as shown, second composition dielectric material 49 is deposited to fill remaining volume of trenches 36 that is above first composition dielectric material 48.

Figure 16:
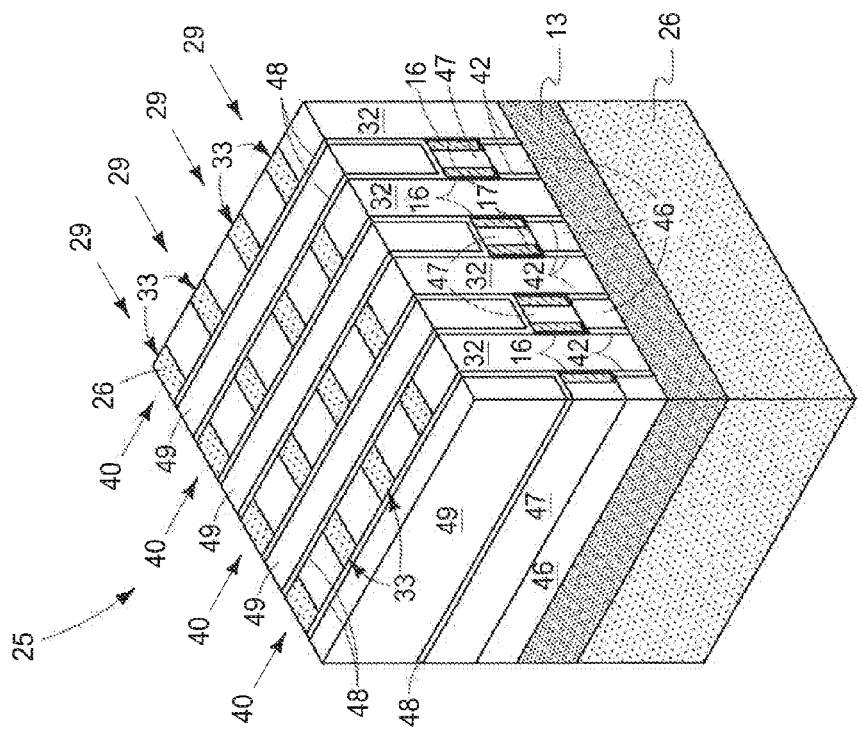

Referring to FIG. 16, dielectric material 48 and dielectric material 49 have been planarized back, including through material 34 (not shown), to expose semiconductor material 26 of pillars 33. Elevationally outermost portions of pillars 33 may comprise outer region 15 of construction 10 in FIG. 1 or outer region 22 of construction 20 in FIG. 2, by way of examples. Again, desired dopant type(s) and concentration(s) for the mid regions and the outer regions may be formed at any suitable time and in any order, ideally sometime after formation of pillars 33, and are not specifically shown in the figures. In one embodiment and as shown, inner region 13 of different gated devices are electrically coupled to one another.

Figure 17:
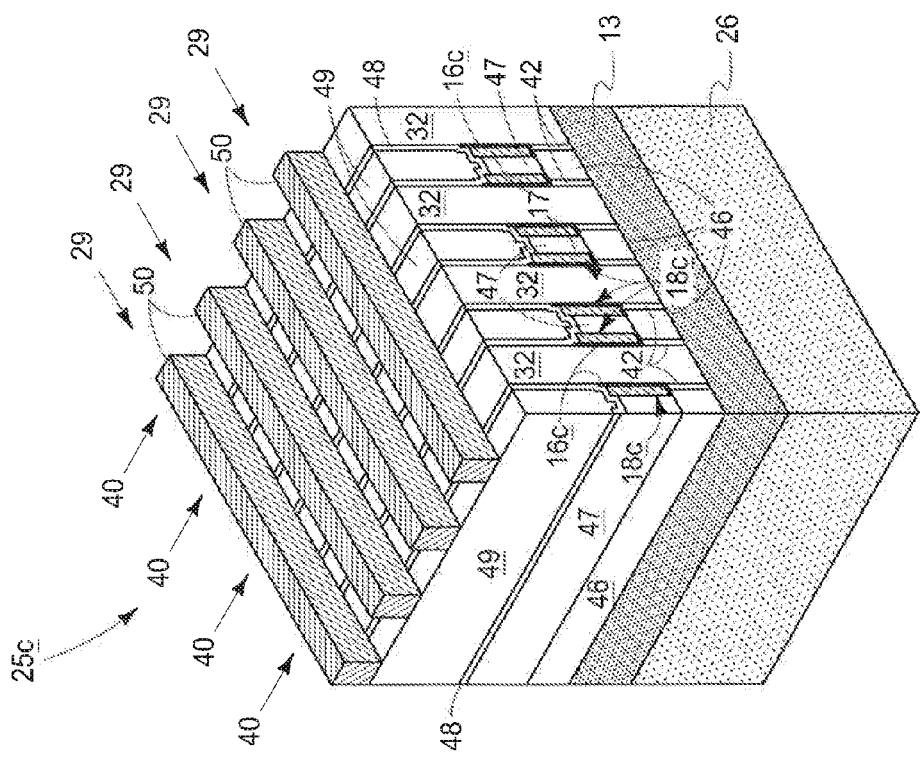
Figure 18:
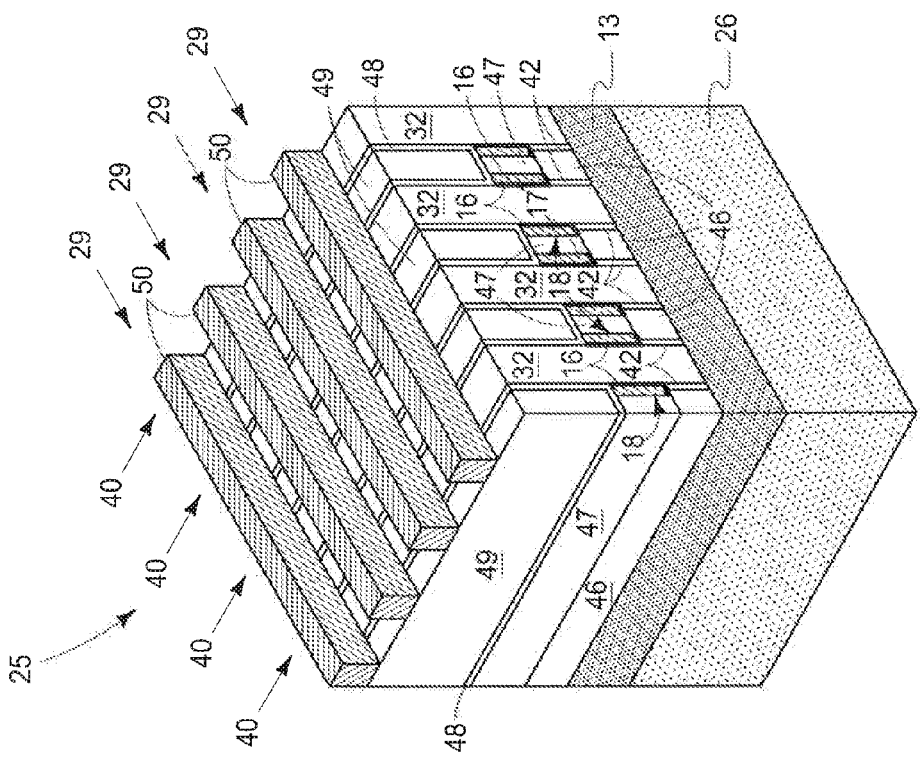
FIG. 18 is a diagrammatic isometric view of an alternate substrate to that shown by FIG. 17.
Figure 19:
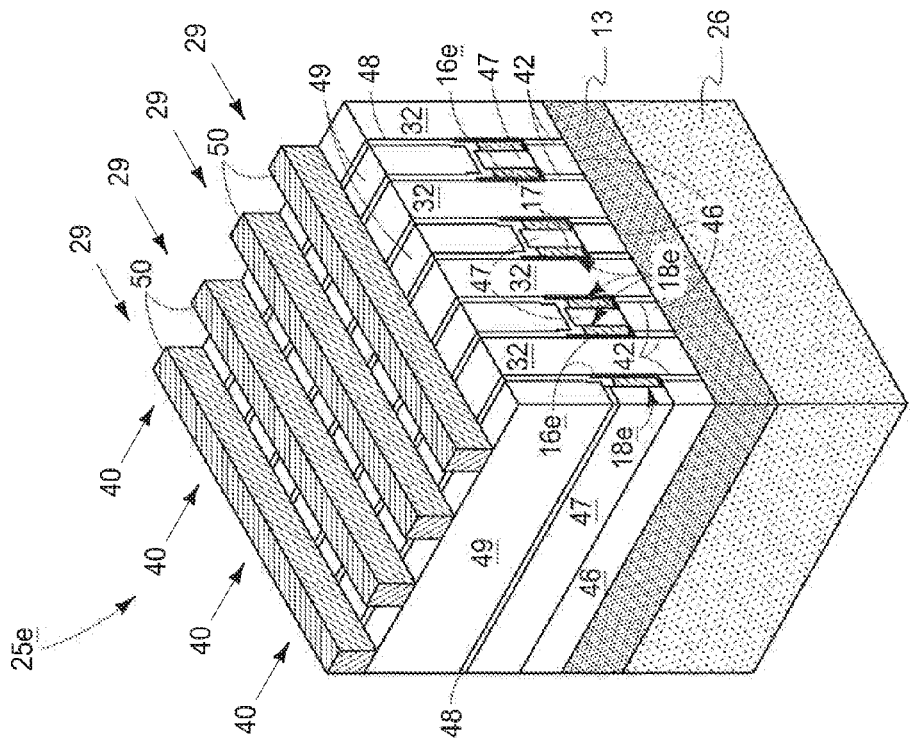
FIG. 19 is a diagrammatic isometric view of an alternate substrate to that shown by FIG. 17.
Figure 20:
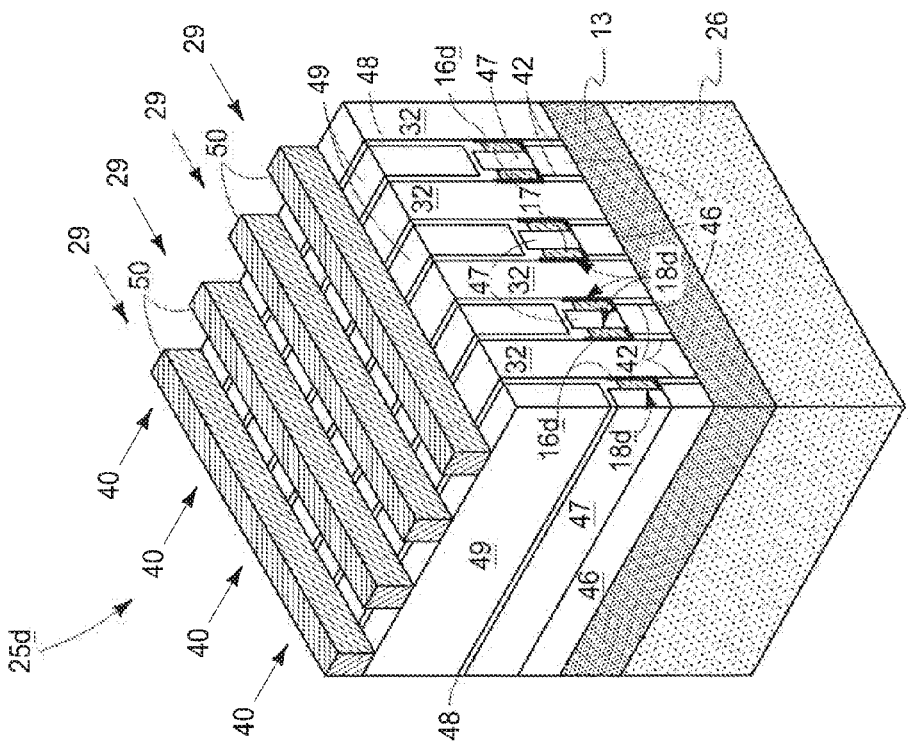
FIG. 20 is a diagrammatic isometric view of an alternate substrate to that shown by FIG. 17.

Referring to FIG. 17, a plurality of conductive data/sense lines 50 has been formed elevationally outward of access lines 18, with lines 50 individually electrically coupling to outer regions of pillars 33 (not viewable in FIG. 16) along individual columns 29.

In one embodiment and as shown in FIG. 17, gate dielectric 16 and gate lines 18 have elevational thickness the same as that of masking material 47 in the finished circuitry construction. Alternately, one or both of gate dielectric 16 and/or gate line 18 may have an elevational thickness that is different from that of masking material 47 in the finished circuitry construction. For example, one or both of gate dielectric 16 and gate lines 18 may have respective elevational thicknesses that are greater than or less than that of masking material 47 in the finished circuitry construction regardless of the respective elevational thicknesses of gate dielectric 16 and gate lines 18 relative one another. Some of such examples are shown in FIGS. 13, 14, 18, 19, and 20 with respect substrate fragments 25a, 25b, 25c, 25d, 25e and gate lines 18, 18b, 18c, 18d, 18e and gate dielectric 16a, 16, 16c, 16d, 16e, respectively. In such Figures, like numerals from the above-described embodiments have been used where appropriate, with some construction differences being indicated with the suffixes "a", "b", "c", "d", and "e", respectively.

In the prior art, conductive gate material for vertically oriented gated devices is etched back to form gates of desired elevational thickness without laterally covering elevationally inner side surfaces of that gate material. Such has resulted in reduced lateral thickness of the gates particularly with wet etching (higher isotropy), yet even with dry etching although to a lesser degree (less isotropy). Accordingly, dry etching has been preferred although wet etching is more controllable to produce repeatable and consistent elevational gate thicknesses. Further, dry etching can damage remaining exposed surfaces of the gate material at the conclusion of the dry etching. Laterally covering elevationally inner side surfaces of the gate material during etching may facilitate use of more desirable wet etching. Nevertheless, the invention is not so limited except where specifically claimed.

The artisan is capable of selecting any suitable etching chemistry, chemistries, and/or conditions for any of the etchings referred to herein. By way of example only, where material 17 is TiN, materials 16, 32, and 34 are silicon dioxide and/or silicon nitride, and material 26 is silicon, suitable etching chemistries for wet etching TiN gate material 17 selectively relative to materials 16, 32, 34, and 26 are a combination of $H_2O_2$, HCl, and $H_2O$ or a combination of $H_2SO_4$, $H_2O_2$, and $H_2O$.

CONCLUSION

In some embodiments, a method of forming an array of gated devices comprises forming trenches between walls that longitudinally extend in rows and project elevationally from a substrate. The walls comprise semiconductor material. Gate dielectric is formed within the trenches laterally over side surfaces of the walls and conductive gate material is formed within the trenches laterally over side surfaces of the gate dielectric. Side surfaces of an elevationally inner portion of the gate material within the trenches are laterally covered with masking material and side surfaces of an elevationally outer portion of the gate material within the trenches are left laterally uncovered by the masking material. The elevationally outer portion of the gate material that is laterally uncovered by the masking material is removed while the side surfaces of the elevationally inner portion of the gate material are laterally covered by the masking material to form gate lines within the trenches laterally over elevationally inner portions of the walls.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of gated devices, comprising:
   forming trenches between walls that longitudinally extend in rows and project elevationally from a substrate, the walls comprising semiconductor material;
   forming gate dielectric within the trenches laterally over side surfaces of the walls and forming conductive gate material within the trenches laterally over side surfaces of the gate dielectric;
   laterally covering side surfaces of an elevationally inner portion of the gate material within the trenches with masking material and leaving side surfaces of an elevationally outer portion of the gate material within the trenches laterally uncovered by the masking material; and
   removing the elevationally outer portion of the gate material that is laterally uncovered by the masking material while the side surfaces of the elevationally inner portion of the gate material are laterally covered by the masking material to form gate lines within the trenches laterally over elevationally inner portions of the walls.

2. The method of claim 1 wherein the walls comprise pillars of the semiconductor material spaced longitudinally within the walls by dielectric material.

3. The method of claim 1 wherein forming the gate material within the trenches comprises:
   depositing the gate material elevationally over tops of the walls, laterally over the wall side surfaces, and elevationally over bases of the trenches; and
   removing the gate material from being over the tops of the walls and from being over at least a majority of the trench bases before the laterally covering with the masking material.

4. The method of claim 3 wherein the removing of the gate material before the laterally covering with the masking material comprises elevationally recessing the gate material within the trenches.

5. The method of claim 3 wherein forming the gate dielectric within the trenches comprises:
   depositing the gate dielectric elevationally over the tops of the walls, laterally over the wall side surfaces, and elevationally over the trench bases before depositing the gate material; and
   removing the gate dielectric from being over the tops of the walls and from being over at least a majority of the trench bases before the laterally covering with the masking material.

6. The method of claim 1 wherein the laterally covering and the leaving sequentially comprises:
   covering the side surfaces of the elevationally outer and inner portions of the gate material within the trenches with the masking material; and
   removing the masking material from covering the side surfaces of the elevationally outer portion of the gate material within the trenches.

7. The method of claim 6 wherein the removing of the masking material comprises wet etching.

8. The method of claim 1 wherein the removing of the gate material comprises wet etching.

9. The method of claim 1 wherein the removing of the elevational outer portion of the gate material removes some of the elevationally inner portion of the gate material that is laterally covered by the masking material.

10. The method of claim 1 wherein the removing of the elevational outer portion of the gate material does not remove any of the elevationally inner portion of the gate material that is laterally covered by the masking material.

11. The method of claim 1 comprising removing an elevationally outer portion of the gate dielectric that is laterally uncovered by the masking material while side surfaces of an elevationally inner portion of the gate dielectric are laterally covered by the masking material to form gate dielectric that is elevationally coextensive to tops of the individual gate lines.

12. The method of claim 1 wherein the removing of the elevationally outer portion of the gate material that is laterally uncovered by the masking material is conducted selectively relative to the gate dielectric to leave the gate dielectric laterally covering the side surfaces of an elevationally outer portion of the walls.

13. The method of claim 1 wherein the masking material is dielectric.

14. The method of claim 13 wherein the masking material remains as part of a finished circuitry construction of the array.

15. The method of claim 14 wherein the gate dielectric has an elevational thickness the same as that of the masking material in the finished circuitry construction.

16. The method of claim 14 wherein the gate dielectric has an elevational thickness greater than that of the masking material in the finished circuitry construction.

17. The method of claim 14 wherein the gate dielectric has an elevational thickness less than that of the masking material in the finished circuitry construction.

18. The method of claim 14 wherein the gate lines have an elevational thickness the same as that of the masking material in the finished circuitry construction.

19. The method of claim 14 wherein the gate lines have an elevational thickness greater than that of the masking material in the finished circuitry construction.

20. The method of claim 14 wherein the gate lines have an elevational thickness less than that of the masking material in the finished circuitry construction.

21. The method of claim 1 wherein the masking material at conclusion of the removing has an elevational thickness the same as that of the gate lines.

22. The method of claim 1 comprising after the removing, filling remaining volume of the trenches with dielectric material.

23. The method of claim 22 wherein the filling comprises:
depositing a first composition dielectric material to line and less-than-fill the remaining volume of the trenches; and
depositing a second composition dielectric material within the trenches over the first composition dielectric material, the first and second compositions being different relative one another.

24. The method of claim 23 wherein the second composition dielectric material is deposited to fill remaining volume of the trenches that is above the first composition dielectric material.

* * * * *